United States Patent

Kato et al.

[11] Patent Number: 5,882,826
[45] Date of Patent: *Mar. 16, 1999

[54] MEMBRANE AND MASK, AND EXPOSURE APPARATUS USING THE MASK, AND DEVICE PRODUCING METHOD USING THE MASK

[75] Inventors: Hideo Kato; Keiko Chiba, both of Utsunomiya; Hiroshi Maehara, Yokohama, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 680,796

[22] Filed: Jul. 16, 1996

[30] Foreign Application Priority Data

Jul. 18, 1995 [JP] Japan ..................................... 7-181686
Jun. 18, 1996 [JP] Japan ..................................... 8-156859

[51] Int. Cl.$^6$ ....................................................... G03F 9/00
[52] U.S. Cl. .................................. 430/5; 378/35; 428/698
[58] Field of Search ................................. 430/5, 322, 324; 428/195, 698, 699; 378/34, 35

[56] References Cited

U.S. PATENT DOCUMENTS

| 5,320,703 | 6/1994 | Ikeda et al. | 117/68 |
| 5,469,489 | 11/1995 | Miyake et al. | 430/5 |
| 5,589,304 | 12/1996 | Chiba et al. | 430/5 |

FOREIGN PATENT DOCUMENTS

| 56-140629 | 11/1981 | Japan . |
| 4332115 | 11/1992 | Japan . |
| 7012017 | 1/1995 | Japan . |

*Primary Examiner*—S. Rosasco
*Attorney, Agent, or Firm*—Fitzpatrick, Cella, Harper, & Scinto

[57] ABSTRACT

X-ray or vacuum-ultraviolet-ray transmissive mask membrane is constituted by a laminated film. The laminated film is obtained by continuously forming a SiCN film on one of or each of sides of a SiC film. Thereby, a membrane, which is superior in physical or mechanical strength and in surface conditions and optical transmittance, is provided. Moreover, there is provided a mask using the membrane.

11 Claims, 4 Drawing Sheets

PRODUCTION FLOW OF SEMICONDUCTOR DEVICE

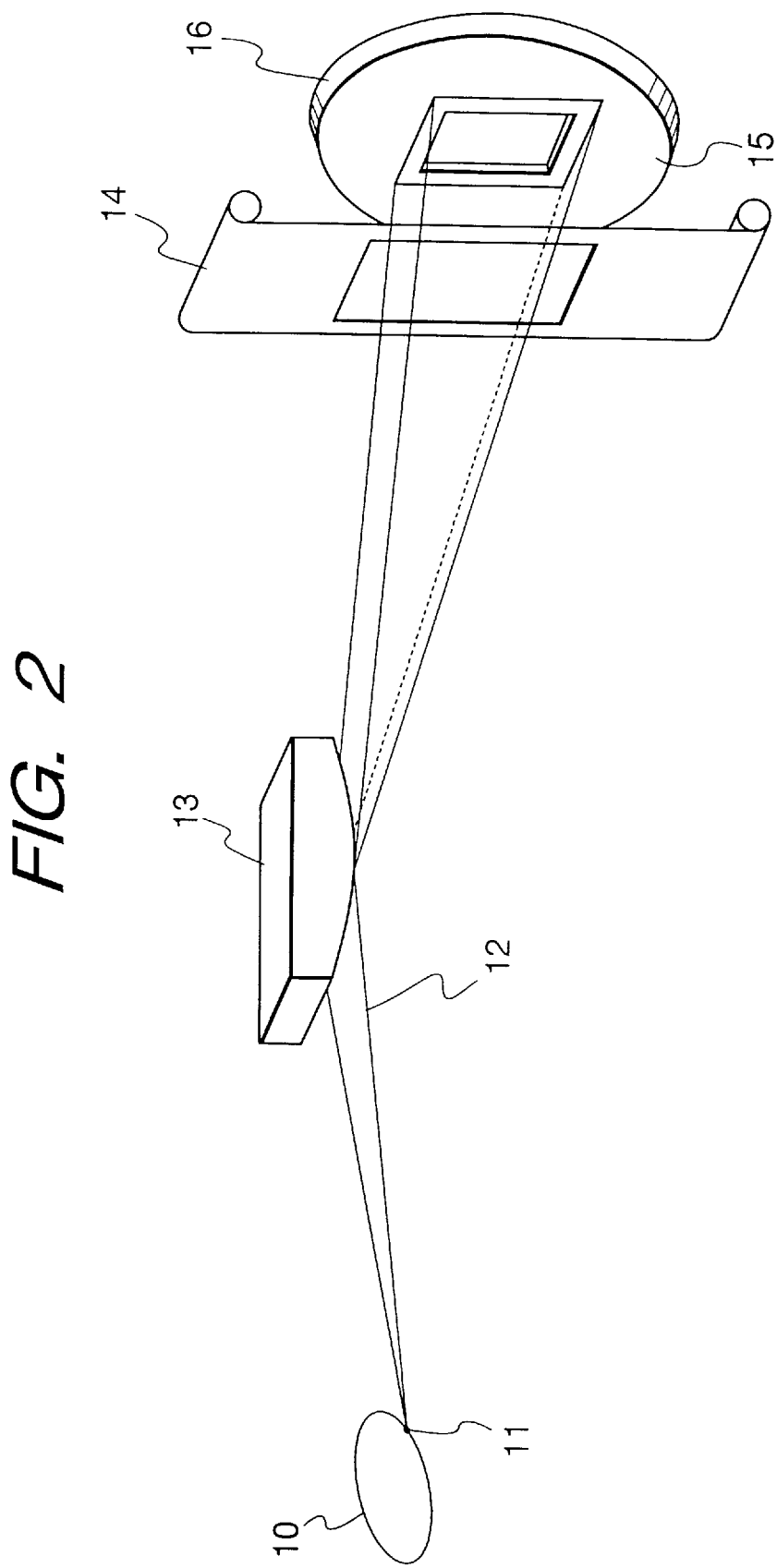

PRODUCTION FLOW OF SEMICONDUCTOR DEVICE

WAFER PROCESS

MEMBRANE AND MASK, AND EXPOSURE APPARATUS USING THE MASK, AND DEVICE PRODUCING METHOD USING THE MASK

BACKGROUND OF THE INVENTION

1. Field of the Invention

The present invention relates to the technical field of a mask to be used in performing lithography to produce devices such as semiconductors.

2. Related Background Art

A method of manufacturing various kinds of products by partly changing the quality of a surface portion of material to be worked through lithography techniques has been widely utilized industrially, especially in the electronic industry. In accordance with this method, products having surface alteration portions of the same pattern can be manufactured in large quantities. Alteration of a surface portion of material to be worked is performed by irradiating the surface portion with various kinds of energy beam radiation. In order to form a pattern, a mask having an energy intercepting member partly disposed, is used. When the irradiated energy beam radiation is visible light or ultraviolet light, a mask is used in which a black opaque pattern made of silver, chrome or the like is provided on a transparent substrate made of glass, quartz or the like.

However, as the formation of a finer pattern is demanded, vacuum ultraviolet rays and X-rays, which are of shorter wavelength, have attracted attention. Such energy beam radiation cannot be transmitted through glass or quartz plate, such as those used as mask substrate members when using visible or ultraviolet light. Thus, glass and quartz are not suitable materials for a mask substrate when using vacuum ultraviolet rays or X-rays.

Thus, in lithography when using vacuum ultraviolet rays or X-rays, a mask is formed by using various kinds of inorganic films, for example, a ceramic film made of silicon, silicon nitride, silicon carbide, diamond or the like, or organic high-polymer thin films made of polyimide, polyamide, polyester or the like, or multi-layered thin films of such films, as an energy beam radiation transmitting element, and by then forming metal such as gold, platinum, tungsten and tantalum on the surfaces of these films, as an energy beam radiation absorbing element.

Among candidates for materials for a mask membrane, Si, BN, SiN and SiC are inorganic materials, which are appropriate for practical use. Among them, much attention has recently been focused on SiC.

Among ceramic materials, SiC is most chemically stable and is superior in mechanical strength. Moreover, the coefficient of thermal expansion of SiC is close to that of Si. Also, SiC is superior in thermal conductivity.

The typical process for forming a SiC membrane film is a CVD (Chemical Vapor Deposition) process. When the formed film, however, is examined, there are various problems. Despite efforts to improve the film by devising production methods and taking additional measures, a solution to basic problems has not been found.

Problems with the conventional SiC membrane films are enumerated below:

(1) The conventional SiC membrane films have poor surface conditions (due to abnormal crystal growth).

(2) The conventional SiC membrane films have low alignment-light transmittance (owing to the inherent absorption and to the scattering in the films and on the surfaces thereof).

(3) Each of the conventional SiC membrane films has nonuniform thickness (it is difficult to control the thickness in each film, in each lot and among lots).

Japanese Patent Appln. Publication Nos. 4-332115 and 7-12017 Official Gazettes have proposed a $SiC/Si_3N_4$ film as a countermeasure against these problems. However, a single $SiC/Si_3N_4$ film has compressive stress which causes deflection and is thus unsuitable for a membrane for X-ray lithography. It is, therefore, necessary to perform an annealing process or the like for changing the compressive stress into a tensile stress. Further, Japanese Patent Appln. Laid-Open No. 56-140629 Official Gazette also has proposed a $SiC/Si_3N_4$ film. However, in this case, two kinds of targets are needed as sputtering targets to laminate a $Si_3N_4$ film on a SiC film. Thus, what is called a dual sputtering system has to be prepared as an apparatus for sputtering. Alternatively, it is necessary to perform a complex operation including the steps of breaking a vacuum once and replacing a target with another target.

SUMMARY OF THE INVENTION

The present invention aims to solve the problems encountered in the aforementioned prior art.

It is, accordingly, an object of the present invention to provide a membrane which is superior in physical or mechanical strength and in surface conditions and optical transmittance.

Further, it is another object of the present invention to provide an excellent mask that uses such a membrane.

Moreover, it is still another object of the present invention to provide an exposure apparatus which uses such a mask.

Furthermore, it is yet another object of the present invention to provide a device producing method which uses such a mask.

To achieve the foregoing objects, in accordance with an aspect of the present invention, there is provided a membrane which comprises a laminated film consisting of SiC and SiCN films.

Further, in accordance with another aspect of the present invention, there is provided a mask in which a mask pattern is formed on a laminated film consisting of SiC and SiCN films.

Moreover, in accordance with still another aspect of the present invention, there is provided a membrane producing method that comprises the step of producing a laminated film, which consists of SiC and SiCN films, by performing a sputter deposition method and/or a CVD method.

Here, the present invention includes embodiments in which a SiCN film is laminated on one of or each of the sides of a SiC film and also in which a boundary between SiC and SiCN films has a nitrogen-component gradient structure.

Furthermore, in accordance with yet another aspect of the present invention, there is provided an exposure apparatus that comprises means for performing an exposure by using a mask having the aforementioned structure. Additionally, in accordance with a further aspect of the present invention, there is provided a device producing method that comprises the step of producing a device by using a mask having the aforementioned structure.

BRIEF DESCRIPTION OF THE DRAWINGS

FIG. 2 is a view illustrating an entire configuration of an X-ray exposure apparatus according to an embodiment of the present invention;

DETAILED DESCRIPTION OF THE PREFERRED EMBODIMENTS

Hereinafter, the preferred embodiments of the present invention will be described in detail by referring to the accompanying drawings.

<Embodiment 1>

Hereunder, a method of producing a mask structure, which is suitable for X-ray or vacuum-ultraviolet-ray lithography, according to a first embodiment (Embodiment 1) of the present invention will be described.

Figure 1A:
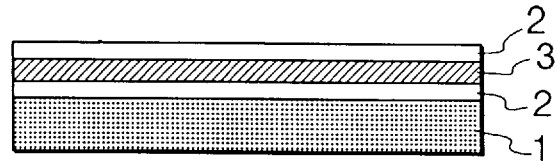
FIGS. 1A to 1E are views illustrating a configuration of a mask structure and a method of producing the mask structure according to an embodiment of the present invention.

As shown in FIG. 1A, there was prepared a silicon substrate 1 having a diameter of 3 inches and a thickness of 1 mm. Further, an SBR sputtering apparatus was employed as an apparatus for forming a film, a SiC sintered element was prepared as a sputtering target, and pure argon gas and pure nitrogen gas were prepared as sputtering gases.

First, the ratio of the flow rate of argon gas to nitrogen gas was set at 1:1. Then, a sputtering was performed at an input power of 200 W and at a gas pressure of 4 Pa. For 30 minutes, a SiCN film 2 having a thickness of about 0.4 μm was formed. Moreover, a sputtering was successively performed by using a 100 percent argon gas at the same power and at the same gas pressure for 100 minutes to form a SiC film 3 having a thickness of about 2 μm. Subsequently, a SiCN film of about 2 μm thickness was continuously formed on the SiC film 3 under the same conditions. When measuring the stress produced in the multilayered film thus formed, the film exhibited a tensile stress of $2 \times 10^9$ dyne/cm$^2$. In the embodiment, the multilayered film had a structure in which a SiC film was sandwiched on both sides thereof by SiCN films. The multilayered film, however, may have another structure in which SiCN film is formed only on one of the sides of a SiC film.

Figure 1B:
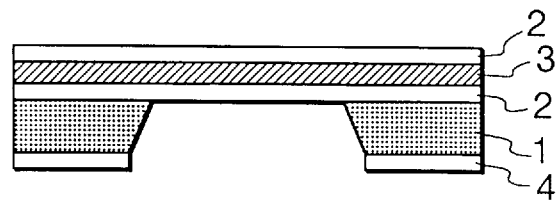

Next, as shown in FIG. 1B, a SiCN film 4 having a thickness of about 2 μm was formed on regions other than a rectangular portion corresponding to a pattern on the back surface of the silicone substrate 1. This was accomplished by the steps of fixedly mounting a rectangular aluminum plate of 20 mm in length and 20 mm in width to perform formation of SiCN film, and thereafter removing the aluminum plate. Subsequently, a 30 percent KOH solution was set in a silicone back-etching apparatus. Then, the etching was performed at 110° C. for about 3 hours, so that Si of the substrate was removed from the back surface thereof by using the SiCN film as a mask, to form a radiation transmitting portion.

Figure 1C:
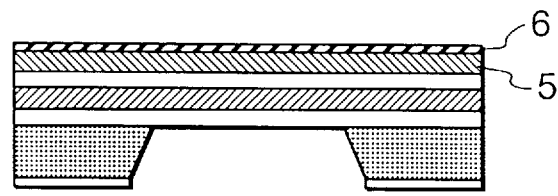

Next, as illustrated in FIG. 1C, a radiation absorbing film 5 was formed on the multilayered film by performing a similar sputtering evaporation method with a tungsten target and an argon gas. Film forming conditions were as follows: input power was 75 W; the gas pressure was 4 Pa; and the film forming time was 1 hour. Under such conditions, a tungsten film having a thickness of 0.8 μm was formed. Moreover, a chrome film 6 having a thickness of 0.1 μm was evaporated onto the absorbing film 5.

Figure 1D:
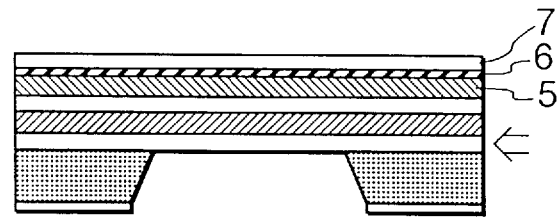
Figure 1E:
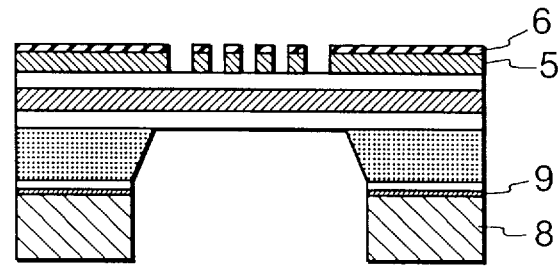

Next, as shown in FIG. 1D, an EB resist coat 7 was added to have a thickness of 0.4 μm by spin coater. After the resist was pre-baked, a mask pattern was drawn with line width of 0.3 μm by EB drawing (or writing) apparatus. A resist pattern with line width of 0.3 μm was formed through a predetermined developing process. Subsequently, a Cr intermediate mask pattern 6 with line width of 0.3 μm, was formed by a dry-etching apparatus using CF$_4$ gas as an etching gas, further using the resist pattern 7 as a mask. Then, after the resist was removed with O$_2$ gas plasma, the pattern etching was performed on the tungsten layer 5 with SF$_6$ gas plasma to form a radiation absorbing pattern of tungsten having a line width of 0.3 μm and a height of 0.8 μm. Finally, a lithography mask structure was formed, as illustrated in FIG. 1E, by bonding a doughnut-like frame 8 of Pyrex glass 3 inches in diameter and 8 mm in thickness by an epoxy adhesive 9.

As a modification of this embodiment, the process of removing the predetermined portion of the silicone substrate by the back-etching may be performed after forming the mask pattern. The material of the radiation absorbing element is not limited to tungsten. Heavy metals or an alloy of heavy metals such as gold, platinum, tungsten, tantalum, molybdenum and nickel may be employed.

<Embodiment 2>

Next, a method of producing a mask structure according to a second embodiment (Embodiment 2) of the present invention will be described. The embodiment is characterized by forming a multilayered film of a membrane by CVD method. The explanation of processes or steps similar to those employed in Embodiment 1, will be simplified.

First, a SiCN film having a thickness of about 0.5 μm was formed on a silicone substrate of 3 inches in diameter and 1 mm in thickness, by CVD method. Then, a SiC film having a thickness of about 1 μm was further formed by CVD method similarly and was laminated thereon. Subsequently, a SiCN film having a thickness of about 0.5 μm was laminated on the SiC film.

Then, a Cr film having a thickness of 500 Å was evaporated as an etching stopper layer. Subsequently, a W layer and a Cr layer, which were 0.8 μm and 0.1 μm in thickness, respectively, were formed under the conditions similar to those of Embodiment 1. Thereafter, a radiation absorbing element pattern was formed through a process similar to the process employed in Embodiment 1. Finally, a process for Cr oxidation and light transmission was performed through oxygen plasma action thereon.

<Embodiment 3>

Next, a method of producing a mask structure according to a third embodiment (Embodiment 3) of the present invention will be described. The embodiment is characterized in that a SiCN film is formed by sputtering method and a SiC film is formed by CVD method.

First, a SiCN film having a thickness of 0.5 μm was formed on the silicone substrate by reactive sputtering method. Then, a SiC film having a thickness of about 1.5 μm was further formed by LP-CVD method and was laminated thereon. Subsequently, a SiCN film having a thickness of 0.5 μm was formed by reactive sputtering method.

Thereby, a membrane film having good surface conditions can be formed. In this case, since the exchange of the gas takes time, a boundary portion between the SiC and SiCN films has a nitrogen-component gradient structure.

<Embodiment 4>

Next, a method of producing a mask structure according to a fourth embodiment (Embodiment 4) of the present invention will be described. The embodiment is characterized by a SiCN film formed as a nitrogen gradient film.

A SiC sintered element was prepared as a sputtering target, and also pure argon gas and pure nitrogen gases were prepared as sputtering gas. First, the ratio of the gas flow rate of the argon gas to nitrogen gas was set at 1:1. Then, a sputtering was performed at an input power of 200 W and at a gas pressure of 4 Pa. Every ten minutes, the gas flow rate of the nitrogen gas was lowered. Then at the gas flow rate ratio of 1:0.1, a SiCN film having a thickness of about 0.8 μm was formed for 60 minutes. Further, the sputtering was successively performed with 100 percent argon gas. As a result of performing such a process at the same power and the same gas pressure for 50 minutes, a SiC film having a thickness of about 1 μm was formed. Next, a SiCN film was continuously formed again on the SiC film under the same conditions. Namely, the film formation was started at the gas flow rate ratio of 1:0.1 and ended at 1:1. Thus, a mask membrane film was produced by continuously forming a gradient SiCN film having a thickness of about 0.8 μm. When measuring the stress in the film, the film exhibits a tensile stress of $5 \times 10^8$ dyne/cm$^2$.

Because the rest of the production process was similar to the process in Embodiment 1, its explanation is omitted.

<Embodiment 5>

Next, a method of producing a mask structure according to a fifth embodiment (Embodiment 5) of the present invention will be described.

A gradient SiCN film having a thickness of about 0.6 μm was formed on a silicone substrate 3 inches in diameter and 1 mm in thickness, by CVD method, namely, by using gaseous methane, silane and ammonia as reactive gases and gradually decreasing the quantity of gaseous ammonia. Moreover, a SiC film having a thickness of about 1 μm was formed by CVD method similarly and was laminated thereon. Subsequently, a gradient SiCN film having a thickness of about 0.6 μm was similarly formed and was laminated thereon, to form a membrane.

In accordance with each of the aforementioned embodiments of the present invention, the following excellent effects and advantages can be obtained.

(1) The surface conditions of the surfaces of the membrane film can be improved by providing a SiCN film on the surface of a SiC film. SiCN is an amorphous film, thus the deterioration of surface conditions owing to deposition of crystals can be prevented.

(2) SiC film is continuously formed on the amorphous film, so that the generation of coarse crystals can be prevented. This means an improvement upon deterioration due to the scattering of alignment light, not only in the surface portion but also in the inner portion of the film.

(3) According to the comparison between a SiC film and a layered film of SiC and SiCN layers of equal thickness when the SiC film and the layered film have an equal thickness, the layered film can considerably improve the alignment light transmittance and also can drastically reduce the loss due to scattering.

(4) SiC film can obtain a tensile stress, while a SiCN film can obtain a compressive stress. Thus, a film exhibiting a small tensile stress can be obtained by laminating a SiC film and a SiCN film.

(5) In the case of a sputtering evaporation method, continuous formation of film is possible by using the same target but changing the kind of gas.

<Embodiment 6>

Next, an embodiment of an X-ray exposure apparatus using an X-ray mask having a membrane produced in the aforementioned manner, will be described hereinbelow.

FIG. 2 is a diagram illustrating the configuration of the entire X-ray exposure apparatus. As illustrated in this drawing, sheet-beam like synchrotron radiation light 12 radiated from an emission point 11 of a synchrotron radiation source 10 is enlarged in a direction perpendicular to a radiation-light orbital plane by a convex mirror 13 having a small curvature. The enlarged radiation light is adjusted by a moving shutter 14 in such a manner that exposure is uniform in an irradiation area. The radiation light having passed through the shutter 14 is led to X-ray mask 15. The X-ray mask 15 is made by the method employed in one of the aforementioned embodiments. A wafer 16 is coated with a resist of 1 μm in thickness by spin coating method, and then a pre-bake is performed under predetermined conditions. The wafer 16 is placed in a close proximity to the X-ray mask 15 so as to be spaced within 30 μm or so.

Mask patterns are arranged on a plurality of shot areas of the wafer 16. Subsequently, exposure and replication of mask patterns is performed. Then, wafer is withdrawn and the development is performed. Thereby, a negative resist pattern having a line width of 30 μm and a height of 1 μm, is obtained.

<Embodiment 7>

Next, a microelectronic device manufacturing method using the aforementioned X-ray mask and the aforesaid X-ray exposure apparatus will be described. Incidentally, "microelectronic devices" described herein include semiconductor chips such as ICs and LSIs, liquid crystal devices, micro machines, thin-film magnetic heads and the like. Hereinafter, a semiconductor device as an example.

Figure 3:
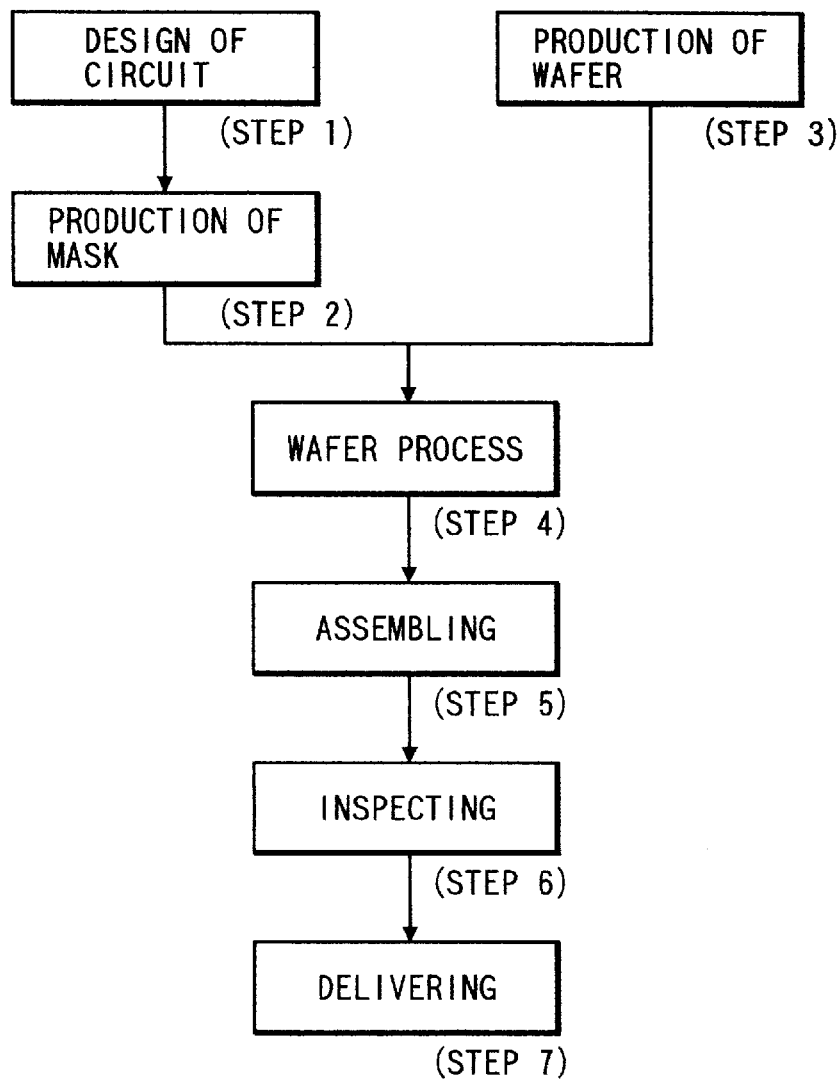
FIG. 3 is a flowchart illustrating an entire process of producing a semiconductor device.

FIG. 3 is a flowchart for illustrating the entire process of producing the semiconductor device. First, in step 1 (for circuit design), the circuit of the semiconductor device is designed. Then, in step 2 (for mask production), a mask on which the designed circuit pattern is formed, is produced. On the other hand, in step 3 (for wafer production), a wafer is produced using materials such as silicone. Step 4 (for wafer process) is referred to as a "preceding step", in which an actual circuit is formed on the wafer by the prepared X-ray mask and the wafer utilizing the lithography techniques. The next step 5 (for assembling) is referred to as a "succeeding step", in which a semiconductor chip is produced by the wafer produced in step 4, and includes an assembly step (for dicing and bonding) and a packaging step (for chip sealing). In step 6 (for inspecting), inspections such as an operation confirmation test, an endurance test or the like are performed on the semiconductor device produced in step 5. The semiconductor device is completed through such steps and thereafter, is delivered (in step 7).

Figure 4:
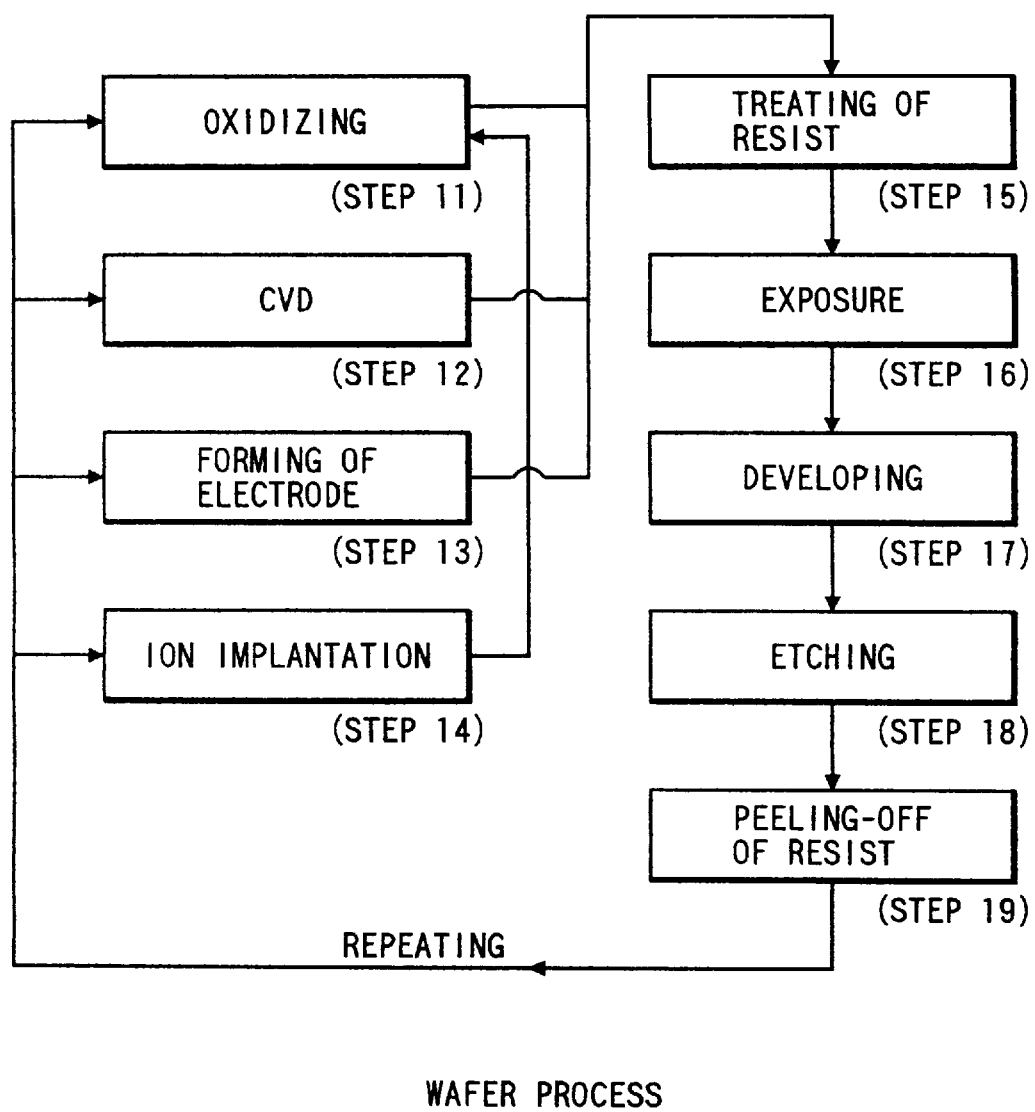
FIG. 4 is a detailed flowchart illustrating a wafer process.

FIG. 4 is a detailed flowchart for illustrating the aforementioned wafer process. First, in step 11 (for oxidizing), the surface portion of the wafer is oxidized. In step 12 (for CVD), an insulating film is formed on the wafer surface. In step 13 (for forming of electrode), an electrode is formed on the wafer by evaporation. In step 14 (for ion implantation), ions are implanted into the wafer. In step 15 (for treating of resist), the wafer is coated with a photosensitive agent. In step 16 (for exposure), a circuit pattern of a mask is exposed and printed on the wafer by the aforesaid exposure apparatus. In step 17 (for developing), the development of the resist of the exposed wafer is performed. In step 18 (for etching), unnecessary parts, other than the developed resist image are removed. In step 19 (for peeling-off resist), the resist which has become unnecessary after the etching is finished, is removed. Multiple circuit patterns are formed on the wafer by repeatedly performing the steps. Consequently, highly integrated semiconductor devices, which are difficult to produce when employing conventional methods, can be produced by using this method.

What is claimed is:

1. A membrane comprising:
   a laminated film which comprises a pair of SiCN films sandwiching a SiC film.

2. A mask comprising:
   a laminated film which comprises a pair of SiCN films sandwiching a SiC film; and
   a mask pattern formed on the laminated film.

3. An exposure apparatus comprising:
   means for performing an exposure by using the mask defined in claim 2.

4. A device producing method comprising the step of:
   producing a device by using the mask defined in claim 2.

5. A membrane producing method including the step of:
   producing a laminated film which comprises a pair of SiCN films sandwiching a SiC film, by performing a sputter deposition method and/or a CVD method.

6. A membrane comprising a laminated film which comprises a pair of SiCN films sandwiching a SiC film, wherein a boundary between the SiC film and SiCN film has a nitrogen-component gradient structure.

7. A mask comprising a laminated film which comprises a pair of SiCN films sandwiching a SiC film, and a mask pattern formed on the laminated film, wherein a boundary between the SiC film and the SiCN film has a nitrogen-component gradient structure.

8. A membrane producing method including the step of producing a laminated film which comprises a pair of SiCN films sandwiching a SiC film, by performing a sputter deposition method and/or a CVD method, wherein a boundary between the SiC film and the SiCN film has a nitrogen-component gradient structure.

9. A membrane comprising:
   a laminated film which comprises SiC and SiCN films, wherein a boundary between the SiC film and SiCN film has a nitrogen-component gradient structure.

10. A mask comprising:
    a laminated film which comprises SiC and SiCN films, wherein a boundary between the SiC film and SiCN film has a nitrogen-component gradient structure; and
    a mask pattern formed on the laminated film.

11. A membrane producing method including the step of:
    producing a laminated film which comprises SiC and SiCN films, wherein a boundary between the SiC film and SiCN film has a nitrogen-component gradient structure, by performing a sputter deposition method and/or a CVD method.

* * * * *

UNITED STATES PATENT AND TRADEMARK OFFICE
CERTIFICATE OF CORRECTION

PATENT NO. : 5,882,826
DATED : March 16, 1999
INVENTOR(S) : HIDEO KATO ET AL.

Page 1 of 2

It is certified that error appears in the above-identified patent and that said Letters Patent is hereby corrected as shown below:

ON THE COVER PAGE AT [56] FOREIGN PATENT DOCUMENTS

"4332115" should read --4-332115--.
"7012017" should read --7-012017--.

COLUMN 2

Line 50, "film" should read --film,--.

COLUMN 4

Line 66, "gases" should read --gas--.
Line 67, "gas." should read --gases.--.

COLUMN 5

Line 40, "the" should be deleted.

UNITED STATES PATENT AND TRADEMARK OFFICE
CERTIFICATE OF CORRECTION

PATENT NO. : 5,882,826

DATED : March 16, 1999

INVENTOR(S) : HIDEO KATO ET AL.

It is certified that error appears in the above-identified patent and that said Letters Patent is hereby corrected as shown below:

COLUMN 6

Line 12, "a" should be deleted.
    Line 16, "Then," should read --Then, the--.
    Line 17, "the" should be deleted.
    Line 26, "micro machines," should read --micromachines--.
    Line 27, "device" should read --device will be described--.
    Line 33, "formed," should read --formed--.
    Line 46, "thereafter," should read --thereafter--.
    Line 60, "image" should read --image,--.

Signed and Sealed this

Twenty-first Day of September, 1999

Attest:

Q. TODD DICKINSON

*Attesting Officer*      *Acting Commissioner of Patents and Trademarks*